US012635091B2

(12) United States Patent     (10) Patent No.:   US 12,635,091 B2

Springer et al.     (45) Date of Patent:     May 19, 2026

(54) OPERATING UNIT FOR A MOLDING MACHINE

(71) Applicant: ENGEL AUSTRIA GmbH, Schwertberg (AT)

(72) Inventors: Klemens Springer, Leonding (AT); David Muehlehner, Neumarkt (AT); Albin Kern, Schwertberg (AT); Friedrich Pernkopf, Gramastetten (AT)

(73) Assignee: ENGEL AUSTRIA GMBH, Schwertberg (AT)

( * ) Notice: Subject to any disclaimer, the term of this patent is extended or adjusted under 35 U.S.C. 154(b) by 207 days.

(21) Appl. No.: 18/372,421

(22) Filed: Sep. 25, 2023

(65) Prior Publication Data

US 2024/0121906 A1     Apr. 11, 2024

(30) Foreign Application Priority Data

Sep. 26, 2022    (AT) .............................. A 50736/2022

(51) Int. Cl.
| | |
|---|---|
| *F16M 11/00* | (2006.01) |
| *B29C 45/17* | (2006.01) |
| *H05K 5/00* | (2006.01) |
| *H05K 5/02* | (2006.01) |

(52) U.S. Cl.
CPC ....... H05K 5/0226 (2013.01); B29C 45/1774 (2013.01); H05K 5/0018 (2022.08)

(58) Field of Classification Search
CPC ................ H05K 5/0226; H05K 5/0018; B29C 45/1774; B29C 2045/7606; B29C 45/76;

F16M 11/06; F16M 11/10; F16M 11/16; G06F 1/16; G06F 1/1607; G06F 1/1615; G06F 1/1616; G06F 1/1618

See application file for complete search history.

(56) References Cited

U.S. PATENT DOCUMENTS

| | | | |
|---|---|---|---|
| 4,718,740 A | * 1/1988 | Cox | ......................... G06F 1/16 |
| | | | 361/679.08 |
| 5,021,922 A | 6/1991 | Davis et al. | |
| 5,383,138 A | * 1/1995 | Motoyama | ............ G06F 1/1679 |
| | | | 361/679.58 |
| 5,559,531 A | 9/1996 | Schiffer | |
| 6,394,402 B2 | * 5/2002 | Coonan | .............. F16M 11/2014 |
| | | | 248/123.11 |

(Continued)

FOREIGN PATENT DOCUMENTS

| | | |
|---|---|---|
| DE | 43 15 902 | 11/1994 |
| DE | 10 2014 013 954 | 4/2015 |

(Continued)

*Primary Examiner* — Amy J. Sterling

(74) *Attorney, Agent, or Firm* — Wenderoth, Lind & Ponack, L.L.P.

(57)      ABSTRACT

An operating unit for a molding machine includes a support, a screen part mounted pivotable on the support, and an operating part mounted pivotable on the screen part and/or the support. The pivotability of the screen part and the operating part results in different use positions for an operator. The operating part is motion-coupled to the screen part and/or to the support by a mechanism and/or a drive unit at least in areas such that a first relative angle between the support and the screen part determines a second relative angle between the screen part and the operating part.

19 Claims, 6 Drawing Sheets

(56) References Cited

U.S. PATENT DOCUMENTS

| | | | |
|---|---|---|---|
| 7,499,029 B2 | 3/2009 | Hara | |
| 7,901,001 B2 | 3/2011 | Seitz et al. | |
| 7,995,331 B2 | 8/2011 | Seitz et al. | |
| 7,997,211 B2 | 8/2011 | Peterson et al. | |
| 8,217,899 B2 | 7/2012 | Hara | |
| 8,826,831 B2 | 9/2014 | Hazzard et al. | |
| 10,245,690 B2 | 4/2019 | Seitz et al. | |
| 11,740,664 B2 * | 8/2023 | Yao ....................... | G06F 1/1681 |
| | | | 361/679.01 |
| 2002/0126110 A1 | 9/2002 | Bowron | |
| 2002/0141146 A1 * | 10/2002 | Mustoe ................ | G06F 1/1649 |
| | | | 361/679.04 |
| 2004/0021639 A1 | 2/2004 | Hara | |
| 2005/0035948 A1 | 2/2005 | Hara | |
| 2009/0020679 A1 | 1/2009 | Seitz et al. | |
| 2009/0050781 A1 | 2/2009 | Seitz et al. | |
| 2009/0219249 A1 | 9/2009 | Hara | |
| 2016/0221133 A1 | 8/2016 | Seitz et al. | |
| 2018/0311879 A1 | 11/2018 | Grimm | |

FOREIGN PATENT DOCUMENTS

| | | |
|---|---|---|
| DE | 10 2015 118 571 | 5/2017 |
| DE | 10 2015 016 051 | 6/2017 |
| DE | 20 2020 101 187 | 4/2020 |
| EP | 0 371 642 | 6/1990 |
| EP | 0 627 291 | 12/1994 |
| EP | 2 028 580 | 2/2009 |
| EP | 2 002 925 | 1/2010 |
| EP | 2 848 357 | 3/2015 |
| WO | 2016/081968 | 6/2016 |

* cited by examiner

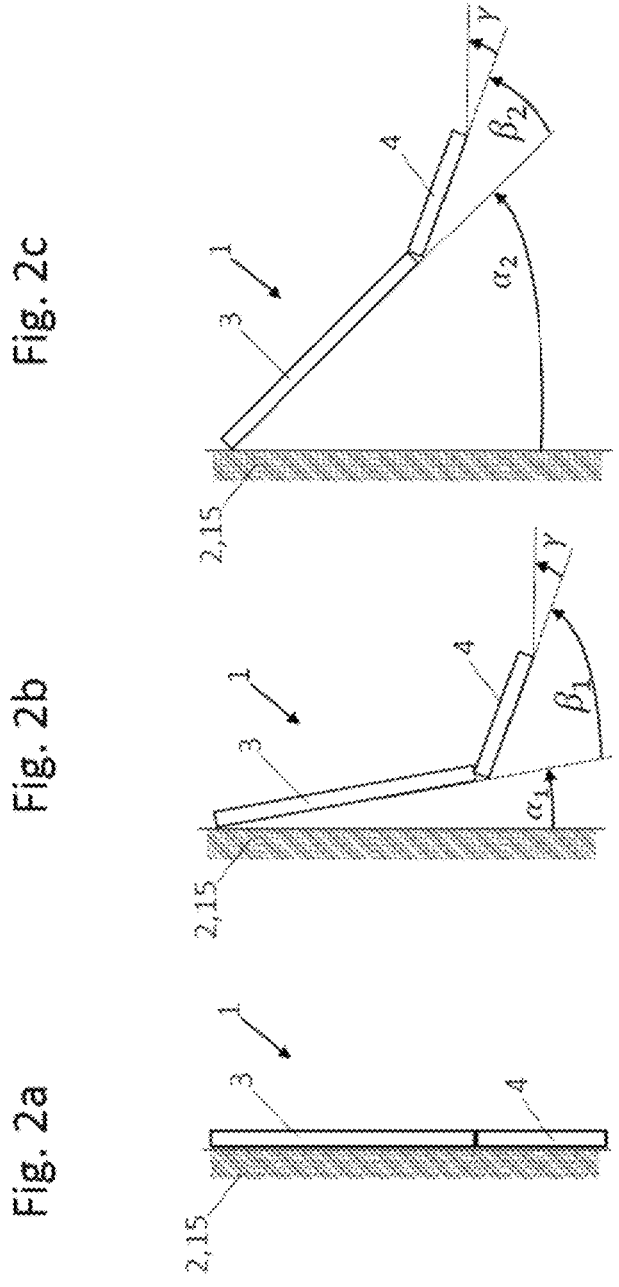

OPERATING UNIT FOR A MOLDING MACHINE

BACKGROUND OF THE INVENTION

The present invention relates to an operating unit for a molding machine as well as a molding machine with such an operating unit.

The molding machines can include injection-molding machines, transfer-molding machines, molding presses and the like. Molding machines in which the plasticized molding material is supplied to an open molding tool are entirely conceivable.

The state of the art will be outlined below with reference to an injection-molding machine. The same applies in general to molding machines.

Generic operating units for injection-molding machines comprise a support, a screen part mounted pivotable on the support and an operating part mounted pivotable on the screen part and/or the support, wherein the pivotability of the screen part and the operating part results in different use positions for an operator.

Operating units are essential component parts for modern injection-molding machines as they represent the functional interface between the operator and the program control unit of the injection-molding machine.

Depending on the machine type and functions of the injection-molding machine, various operating units are used which are usually positioned directly on the molding machine via the support.

As a rule, the screen part serves to display program components, input options and/or motion sequences.

The operating part serves to input commands, parameters and/or prompts from the operator to the injection-molding machine, wherein with modern screen parts (for example touchscreens), these can also be carried out directly on the screen part.

However, there are input elements, such as for example emergency stop switches, which must still be present as haptic input elements (to comply with standard specifications and safety regulations) or are desired in this form for easier handling.

For injection-molding machines, it is common in the state of the art to form the screen part and the operating part as one piece or to connect these components rigidly to each other. This rigid operating unit is usually pivotably connected to the injection-molding machine or coupled to it.

The operating part and the screen part are usually arranged directly on the injection-molding machine and mounted pivotably on it via a support, with the result that the screen part and/or the support and/or the operating part, depending on the operator of the injection-molding machine, can be pivoted in order to give the individual operator an optimum view of the screen part and/or the operating part.

On the other hand, the support, the screen part and/or the operating part can in turn be folded against the injection-molding machine so they are not in the way during automatic operation.

Corresponding pivot mechanisms and/or operating units are known for example from EP 0 371 642 A2, DE 4315902 A1, WO 2016/081968 A2 or U.S. Pat. No. 4,718,740 A.

In order to also be able to adapt the orientation of the operating part and/or the screen part appropriately to the user, it is also known to make them pivotable relative to each other on the injection-molding machine, with the result that it is made possible for an operator to orient an operating part and/or a screen part individually.

Such designs are known for example from EP 2 002 925 B1, EP 2 848 357 A1 or EP 2 028 580 A1.

However, a disadvantage of corresponding designs is that the operating part must be adapted to the screen part manually by the operator, as a result of which the operator themselves must seek, reset or adjust an ideal position.

Moreover, corresponding, adjustable operating units cannot be adjusted completely freely and usually form a unit, separate from the injection-molding machine, which for one thing is in the way (to an extent even constitutes a trip hazard)—when it is not needed—and for another usually takes up valuable space.

SUMMARY OF THE INVENTION

The object of the present invention is to provide an operating unit for a molding machine as well as a molding machine with a corresponding operating unit, with which the previously described disadvantages of the state of the art are at least partly improved and/or a more ergonomic handling is made possible and/or a better, more personalized adjustment is made possible.

According to the invention, an operating unit for a molding machine has a support, as well as a screen part mounted pivotable on the support, and an operating part mounted pivotable on the screen part and/or the support. The pivotability of the screen part and the operating part results in different use positions for an operator (i.e., different positions in which the screen part and operating part are fixed relative to each other to allow use by an operator). The operating part is motion-coupled to the screen part and/or the support by a mechanism and/or a drive unit such that a first relative angle ($\alpha$) between the support and the screen part determines a second relative angle ($\beta$) between the screen part and the operating part.

The motion-coupling of the operating part to the screen part thus makes it possible in a simple manner that when one of these two components is adjusted the other is automatically moved along with it. As a result, the operating part and the screen part are always in an ergonomic orientation relative to each other.

Thus, for example, an operator can orient the operating part and/or the screen part according to individual requirements (for example, wherein the operator enables a perpendicular view onto the screen part) and the respectively other part is automatically ergonomically adapted in order to enable an optimum handling and/or view for the operator.

There are different use positions, wherein in the different use positions the relative angles can also differ relative to one another.

By molding machines can be meant injection-molding machines, transfer-molding machines, molding presses and the like. Molding machines in which the plasticized molding material is supplied to an open molding tool are also entirely conceivable.

A device according to the invention can be employed by being used in embodiment variants already known in the state of the art, as described in the introduction to the description for example, and installed subsequently.

Preferably, the screen part is arranged above the operating part.

The drive unit can be realized by the first drive unit mentioned below and/or the second drive unit mentioned below.

A motion-coupling by means of a drive unit can mean that the drive unit is actuated, for example via a control or regulating unit (for example by means of a controller or regulator), so as to produce the motion-coupling.

A motion-coupling can mean that a position or movement of a first element (for example of the screen unit) leads to a position or a movement of a second element (for example of the operating unit) that is motion-coupled to the first element, and preferably vice versa.

In a horizontal orientation of the support, the first relative angle ($\alpha$) and the second relative angle ($\beta$) preferably lie in an angle range of between 0° and 90°, preferably between 0° and 80°, particularly preferably between 0° and 70°.

It is also possible that:
the screen part is mounted pivotable relative to the support; and/or
the operating part is mounted pivotable relative to the screen part and/or the support about a substantially horizontal axis.

Preferably, the second relative angle ($\beta$) is inversely proportional to the first relative angle ($\alpha$) as a result of the motion-coupling.

The first relative angle ($\alpha$) and the second relative angle ($\beta$) have the following relationship to each other:

$$\alpha + \beta + \gamma = \frac{\pi}{2}$$

wherein the variable $\gamma$ represents a constant or a function $f(\alpha), f(x)$.

In addition, the variable $\gamma$ can depend on any further variables x and thus be defined as function $f(x)$.

Preferably, the screen part is mechanically coupled to the operating part via at least one compulsory guide, whereby when the screen part is pivoted the operating part is pivoted along with it and/or when the operating part is pivoted the screen part is pivoted along with it.

Preferably, at least one first drive unit is connected to the operating part and/or at least one second drive unit is connected to the screen part.

Drive units can also be realized through spring preloading (for example against a gravitational force of the screen part and/or the operating part).

At least one support device, preferably having a preloaded spring element, can be provided as a first and/or second drive unit. The at least one support device supports a pivoting of the operating part or the screen part.

The at least one drive unit can be formed to drive a first movement of the operating part relative to the support, wherein the first relative angle is changed by the first movement.

The at least one second drive unit can be formed to drive a second movement of the screen part relative to the support and/or the operating part, wherein the second relative angle is changed by the second movement.

At least one first sensor can be connected to the operating part and/or at least one second sensor is connected to the screen part.

The first sensor and/or the second sensor can also be realized by monitoring motor currents of the first drive unit and/or the second drive unit.

Preferably, a control or regulating unit is connected in a signal-conducting manner:
to the at least one first sensor and/or the at least one second sensor; and
to the at least one first drive unit and/or the at least one second drive unit.

The control or regulating unit is formed:
to detect a pivoting of the operating part or the screen part by means of the at least one first sensor or second sensor; and
in accordance with the provided motion-coupling to pivot the screen part or the operating part by means of the at least one first drive unit and/or the second drive unit.

The control or regulating unit is formed:
to detect a pivoting of the operating part or the screen part by means of the at least one first sensor or the second sensor; and
to actuate the at least one first drive unit and/or the at least one second drive unit to support the detected pivoting.

Thus, for example, with operating parts or screen parts with larger dimensions and/or dead weights, a pivoting initiated by the operator can be supported with the result that the operator does not have to apply the entire force (resulting from the weight force of the operating part and/or screen part) for the pivoting.

Preferably, at least one hinge is provided, which at least one hinge tiltably connects:
the screen part or the operating part on the one hand to the support and/or the operating part and/or the screen part on the other.

The at least one support:
is mounted rigid on the molding machine; or
is connected to the molding machine via a bearing element, wherein a movement of the support relative to the molding machine can be carried out via the bearing element.

Preferably, the operating part has a receiving device, wherein at least one mobile element of the operating part can be taken out of the receiving device.

Thus the operator, for example in order to set a parameter (for example contact between mold halves) and/or to input a new program sequence, can take the mobile element out of the receiving device in order to get a better overview or view, with the result that the operator can freely choose their "operating space" (while complying with safety restrictions) in order for example to be able to see into the manufacturing space more effectively.

Furthermore:
at least one damper can be provided, by which at least one damper a pivoting of the operating part and/or the screen part can be damped; and/or
at least one arresting device is provided, by which at least one arresting device the operating part or the screen part can be arrested in at least one position relative to the support.

The screen part can be formed as a flat screen, preferably as a touch pad at least in areas.

Preferably, the screen part is formed as a touch-sensitive screen part at least in areas.

The operating part can preferably have at least one mechanically actuatable operating element, for example an input aid, a keyboard, a function key and/or an emergency stop switch, and/or is formed as a flat screen at least in areas, preferably as a touch pad at least in areas.

The operating part can have at least two part areas, wherein a first part area has operating elements for handling and/or controlling the molding machine and a second part area has safety-related switches, preferably an emergency stop switch.

The operating part can have a flat screen, preferably designed as a touch pad at least in areas.

The operating part can have a keyboard and/or a keypad.

Preferably, the keypad has haptically perceptible markings with which an operator can perceive input elements of the keypad without visual support.

The operating part can have pressure-sensitive or force-sensitive sensors for detecting an actuating force of an operator.

Preferably, the pressure-sensitive or force-sensitive sensors are formed by a piezoelectric plastic film which is constructed in particular structured and has electron pairs allocated to specific input elements.

An operating part designed as a screen at least in areas can be combined with a touch-sensitive touch pad.

Furthermore or in addition, mechanical keys for actuating the touch pad for haptic feedback during the keypress can be attached to the operating part.

The operating part can have mechanical turning elements by means of evaluation of the touch film and also by non-contacting sensors (such as e.g. inductive systems).

The operating part can have at least one actuator, in particular a vibration or swing element, for generating tactile feedback if a permitted or technically possible limit value is approached or exceeded, in particular in relation to actuation forces, travel movements or end stops, so that an acknowledgement from the controller can be sent to an operator when the operating part is actuated.

The operating part can have at least one haptic input element.

Protection is furthermore sought for a molding machine, in particular an injection-molding machine with at least one operating unit according to the invention.

The operating part and/or the screen part can be freely pivotable in a first angle range relative to the support and the operating part is motion-coupled to the screen part in a second angle range.

Thus, for example, in a first angle range of from 0 to 25, preferably 0 to 20, particularly preferably 0 to 15 degrees, of the first relative angle ($\alpha$) and/or of the second relative angle ($\beta$), the operating part and/or the screen part can be freely movable—without motion-coupling relative to the respectively other component—and only if this first angle range is exceeded and passes into the second angle range is the operating part motion-coupled through the mechanism and/or the drive unit to the screen part and/or to the support such that a first relative angle ($\alpha$) between the support and the screen part determines a second relative angle ($\beta$) between the screen part and the operating part.

In one embodiment, as long as the screen part is positioned on the support and/or the molding machine (and thus for example the first relative angle ($\alpha$) is essentially 0 degrees), the operating part can be pivoted in an angle range of from 0 to 25, preferably 0 to 20, particularly preferably 0 to 15 degrees, without the screen part being forcibly moved along with it. Furthermore, if the operating unit is moved out beyond this first angle range (i.e. is transferred into the second angle range), the mechanism and/or a drive unit engages and executes a motion-coupling of the operating part with the screen part, wherein the first relative angle ($\alpha$) between the support and the screen part determines a second relative angle ($\beta$) between the screen part and the operating part.

BRIEF DESCRIPTION OF THE DRAWINGS

Further advantages and details of the invention are revealed by the figures and the associated description of the figures, in which:

6

Figures 1A, 1B:
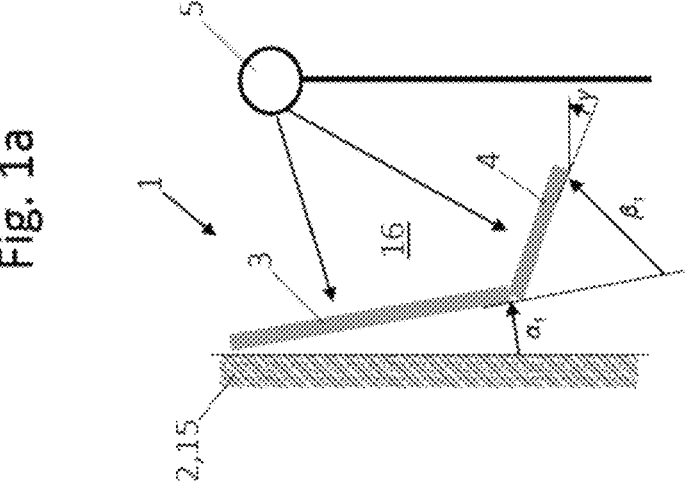
Figure 3:
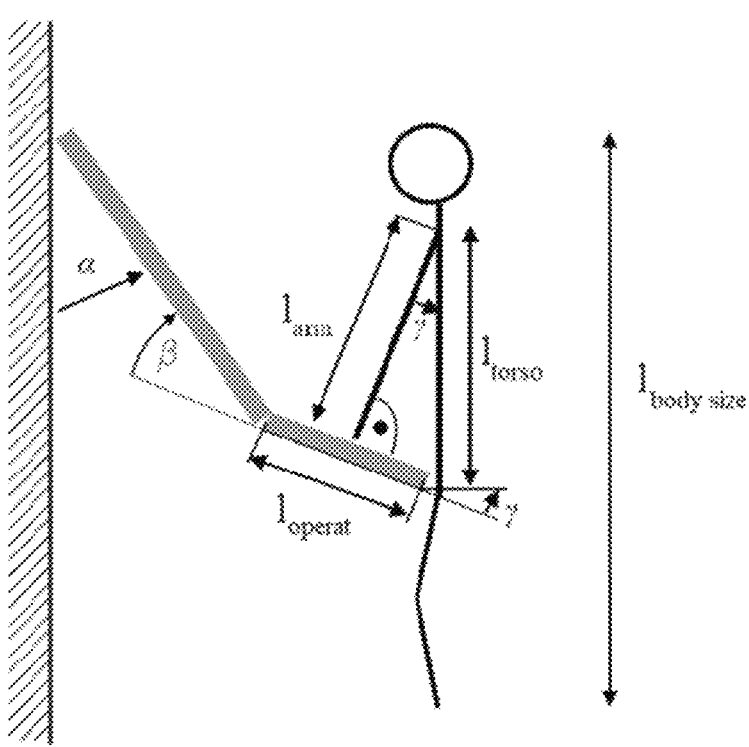
Figures 4A, 4B:
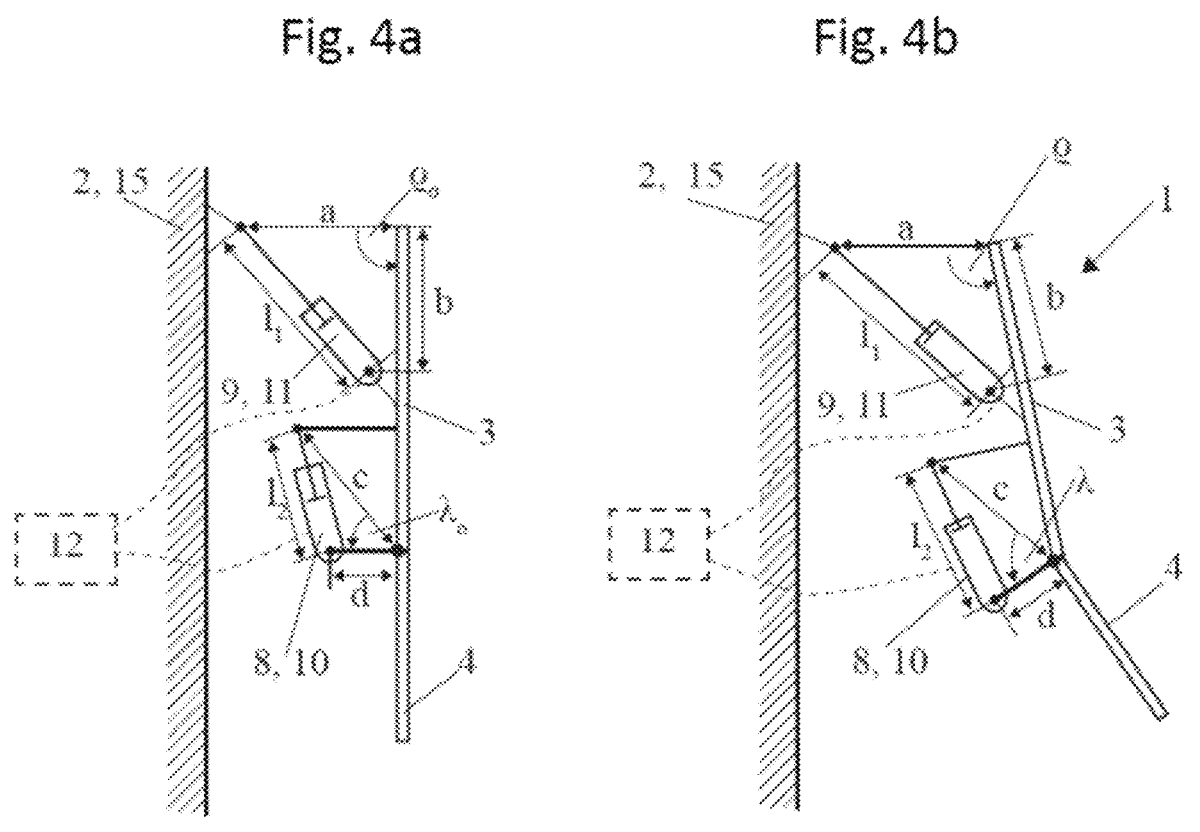
Figure 5:
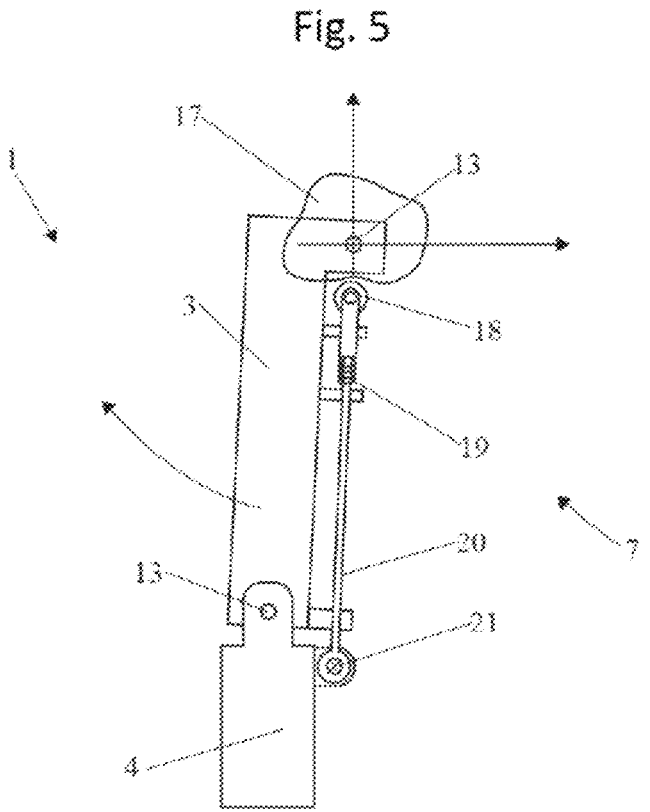
Figure 6:
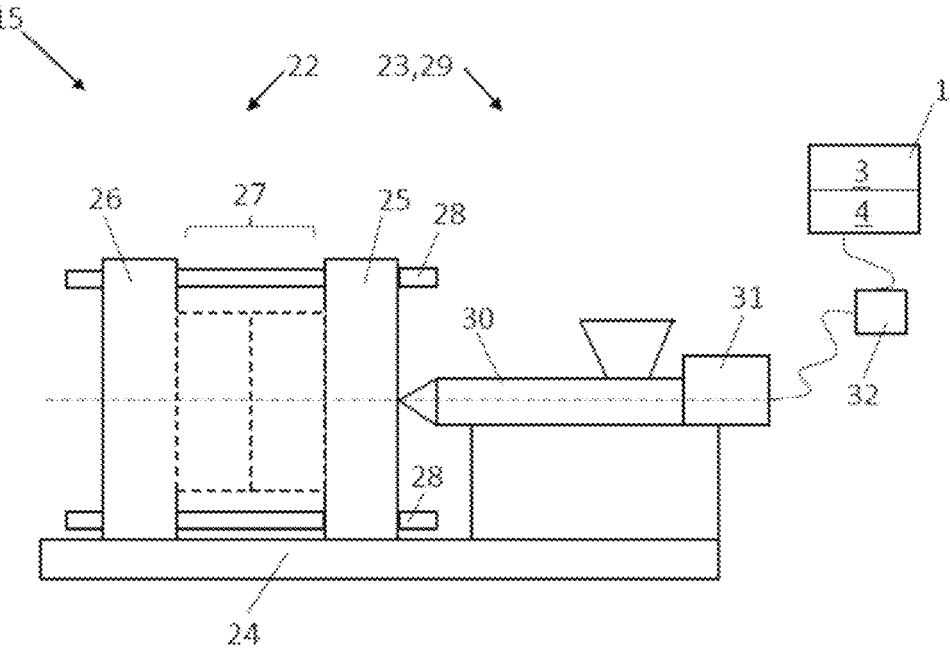

FIGS. 1a, 1b show a first schematic embodiment of an operating unit according to the invention, FIGS. 2a-2c show a second schematic embodiment of an operating unit according to the invention, FIG. 3 shows a third schematic embodiment of an operating unit according to the invention, FIGS. 4a, 4b show a fourth embodiment of an operating unit according to the invention, FIG. 5 shows a fifth embodiment of an operating unit according to the invention, and FIG. 6 shows a molding machine with an operating unit.

DETAILED DESCRIPTION OF THE INVENTION

FIGS. 1a and 1b show a first schematic embodiment of an operating unit 1, wherein FIG. 1a represents a first position of the operating unit 1 and FIG. 1b a second position of the operating unit 1.

The operating unit 1 represented in FIG. 1 comprises a support 2, which is implemented by an external element of the injection-molding machine 15 itself (for example a frame part or a paneling part of the injection-molding machine 15).

The screen part 3 of the operating unit 1 is hinged to this support 2 of the operating unit 1.

The operating part 4 of the operating unit 1 is in turn coupled to the screen part 3 pivotable between different use positions.

The operating part 4 is motion-coupled to the screen part 3 of the operating unit 1 by a mechanism 7 and/or a drive unit 8 such that a first relative angle $\alpha$ between the support 2 and the screen part 3 determines a second relative angle $\beta$ between the screen part 3 and the operating part 4.

This motion-coupling and dependence of the first relative angle $\alpha$ on the second relative angle $\beta$ will be explained in more detail below with reference to FIGS. 1a and 1b and with reference to FIGS. 2a to 2c, whereas reference may be made to FIGS. 4 and 5 in respect of the mechanism 7 and/or the drive unit 8 for driving, coupling and implementing the motion-coupling between screen part 3 and operating part 4.

Thus in the first embodiment of FIGS. 1a, 1b the screen part 3 and the operating part 4 are coupled such that the first relative angle $\alpha_1$ and the second relative angle $\beta_1$ added to a variable $\gamma$ are always 90°

$$(\frac{\pi}{2}$$

in radians), wherein the following applies:

$$\alpha + \beta + \gamma = \frac{\pi}{2}$$

In the embodiment of FIGS. 1a and 1b of the operating unit 1, the variable $\gamma$ is given as a defined chosen constant.

In this embodiment, the angle $\gamma$ formed relative to the horizontal is thus kept constant for all inclination angles $\alpha_i$.

Consequently, the necessary angles of the embodiment of FIGS. 1a and 1b are calculated as $$\alpha_i \in [0, \alpha_{max}]$$

$$\gamma = \gamma_{const} \in [0, 90° - \alpha_{max}]$$

$$\beta_i = 90° - \alpha_i - \gamma_{const}; \in \mathbb{R}^+$$

The movement freedom of the operating unit 1—and thus of the screen part 3 and the operating part 4—is limited by the definition of a maximum first relative angle $\alpha_{max}$.

The second relative angle $\beta$ thus results from the relationship to the first relative angle $\alpha$ and the defined chosen variable $\gamma$.

Thus when the screen part 3 or the operating part 4 is pivoted, the operating part 4 or the screen part 3 is automatically carried along with it according to motion-coupling ratios mentioned above.

In this embodiment, the screen part 3 and the operating part 4 are mounted pivotable about a substantially horizontal axis relative to the support 2.

It can be seen in FIG. 1*a* that the screen part 3 of the operating unit 1 is not oriented optimally relative to the operator 5, as a result of which the viewing direction of the operator 5 and the field of view 16 of the operator 5 do not strike the screen part 3 substantially perpendicularly.

In order to now be able to orient the operating unit 1 more ergonomically for operation, the operator 5 can optimally set the screen part 3 to suit their individual requirements by adjusting it manually for example.

During the adjustment of the screen part 3 by the operator 5, as a result of the motion-coupling, the operating part 4 is now pivoted along with it until an optimum position (represented in FIG. 1*b*) is reached. In this case, the operator 5 is viewing the screen part 3 substantially perpendicularly.

In the schematically indicated embodiment of FIGS. 2*a* to 2*c*, the screen part 3 is again mounted pivotable on the support 2 (implemented by a vertical cover of an injection-molding machine 15) and the operating part 4 is mounted pivotable on the screen part 3.

The screen part 3 and the operating part 4 are again pivotable about a substantially horizontal axis relative to the support 2.

It is also the case in the embodiment of FIGS. 2*a* to 2*c* that the sum of the first relative angle $\alpha$, the second relative angle $\beta$ and the variable $\gamma$ is 90° (or $$\frac{\pi}{2}$$

in radians).

$$\alpha + \beta + \gamma = \frac{\pi}{2}$$

However, the variable $\gamma$ of the embodiment of FIGS. 2*a* to 2*c* is provided as a function of the first relative angle $\alpha$ rather than as a constant. The following applies for example $$\alpha_i \in [0, \alpha_{max}]$$

$$\beta_i = \frac{\alpha_{max}}{2} \sin^2\left(\frac{\pi}{\alpha_{max}} \alpha_i\right)$$

$$\gamma_i = f(\alpha_i) = 90° - \alpha_i - \beta_i; \in \mathbb{R}^+$$

A possible relationship between the first relative angle $\alpha$ and the second relative angle $\beta$ would be as follows:

$$\beta_i = \frac{\pi}{8} \sin^2(4\alpha_i), \text{ where } \alpha_{max} = \frac{\pi}{4} \text{ and } \alpha_i \in [0, \alpha_{max}]$$

Different use positions of the operating unit 1—(i.e., where the screen part 3 and the operating part 4 are fixed in positions to allow use) —are again represented by FIGS. 2*a* to 2*c*, whereby the motion-coupling of the screen part 3 and the operating part 4 is illustrated.

A use position of the operating unit 1 is shown in FIG. 2*a*, in which the operating part 4 and the screen part 3 are positioned on the support 2, whereby the operating unit 1 can be stowed in as space-saving a manner as possible during the operation of the injection-molding machine 15, wherein the screen part 3 is still visible for the operator.

FIG. 3 shows a third embodiment of an operating unit 1 according to the invention, wherein the operating part 4 is again motion-coupled relative to the screen part 3.

The motion-coupling of this embodiment is again implemented via the variable $\gamma$ and the following relationship.

$$\alpha + \beta + \gamma = \frac{\pi}{2}$$

Thus it is again the case in the embodiment of FIG. 3 that the sum of the first relative angle $\alpha$, the second relative angle $\beta$ and the variable $\gamma$ is 90° (or $$\frac{\pi}{2}$$

in radians).

The variable $\gamma$ of the embodiment from FIG. 3 is defined as function $f(x)$, wherein the variable x represents the body size $l_{body\ size}$ of an operator 5.

Assuming
a desired right angle between operating part 4 and the arm of the operator 5
orientation of the operator's hand in the center of the operating part 4
an average ratio 1 of arm span to body size $l_{body\ size}$ (cf. Watts et al.: Anthropometry of young competitive sport rock climbers. In: British Journal of Sports Medicine. No. 37, 2003, pp. 420-424)
the following relationships can be represented in a simplified manner:

$$l_{arm} = \frac{l_{body\ size}}{2}$$

$$l_{torso} = \sqrt{l_{arm}^2 + (l_{operat}/2)^2}$$

$$\frac{\sin\frac{\pi}{2}}{l_{torso}} = \frac{\sin\gamma}{l_{operat}/2}$$

and for $\gamma$ as a function of the variables $x = l_{body\ size}$ $$\gamma = \arcsin\left(\frac{l_{operat}/2}{l_{torso}}\right) = \arcsin\left(\frac{l_{operat}/2}{\sqrt{\left(\frac{l_{body\ size}}{2}\right)^2 + (l_{operat}/2)^2}}\right)$$

can be derived.

FIGS. 4*a*, 4*b* show a third embodiment of an operating unit 1, wherein the operating part 4 and/or the screen part 3 can be moved via a first drive unit 8 and a second drive unit 9.

The first drive unit 8 has a first sensor 10 in order to detect an operating state and/or an actual size of the first drive unit 8.

In the same way, the second drive unit 9 has a sensor 11.

The first drive unit 8 and the second drive unit 9 are each connected in signal-conducting manner to a control or regulating unit (controller) 12, which is represented in dashed lines in these figures.

Through the control or regulating unit 12, control signals can be output to the first drive unit 8 and the second drive unit 9 and signals of the first sensor 10 and/or the second sensor 11 received for regulating purposes.

The second drive unit 9 is formed to carry out a relative movement between the screen part 3 and the support 2 and thus to adjust a first relative angle α.

The first drive unit 8 is formed to carry out a relative movement between the screen part 3 and the operating part 4, whereby a second relative angle β can be adjusted.

If an operator now orients the screen part 3 and/or the operating part 4, such a movement can be detected via the first sensor 10 and/or the second sensor 11.

The control or regulating unit 12 can be formed to support such a pivoting of the operating part 4 or the screen part 3 with the help of the first drive unit 8 and/or the second drive unit 9. Thus, if an operator adjusts the operating part 4 and/or the screen part 3, the operator alone does not have to bear the whole weight force of these components, and instead this movement can be supported by the drive units 8, 9.

The control or regulating unit (controller) 12 of this embodiment is formed such that, if the controller 12 detects a movement of the operating part 4 or the screen part 3 via the first sensor 10 or the second sensor 11, with the help of a stored motion-coupling (for example according to the schematic embodiments of FIG. 1, FIG. 2 or FIG. 3), it actuates the second drive unit 9 or the first drive unit 8 respectively such that the motion-coupling is also retained for each repositioning.

With the help of the known lengths, dimensions and positionings of the components, the following relationship therefore applies for the embodiment of FIGS. 4a, 4b:

With the variable lengths $l_{1,i}$ and $l_{2,i}$, the angular reference of the operating point represented in FIG. 4a can be determined, on the basis of the cosine rule $$l_{2,i}{}^2 = c^2 + d^2 - 2cd\,\cos(\lambda_i)$$

as $$\beta_i = \lambda_i - \lambda_0$$

where $\lambda_i = \lambda_0$ in the operating point of FIG. 4a.
arccos $$\left( \frac{l2,\,i^2 - c^2 - d^2}{2cd} \right)$$

can be deduced directly from this, wherein $$\beta_i = \arccos\left( -\frac{l_{2,i}^2 - c^2 - d^2}{2cd} \right) - \arccos\left( -\frac{l_{2,i}^2 - c^2 - d^2}{2cd} \right)\Bigg|_{l_{2,i}=l_{2,0}}.$$

Analogously, the first relative angle α can be calculated for further operating points as $$\alpha_i = \arccos\left( -\frac{l_{1,i}^2 - a^2 - b^2}{2ab} \right) - \arccos\left( -\frac{l_{1,i}^2 - a^2 - b^2}{2ab} \right)\Bigg|_{l_{1,i}=l_{1,0}}.$$

Two different use positions are again represented by FIGS. 4a and 4b, with the result that the motion-coupling of the screen part 3 and the operating part 4 can be seen.

The remaining components correspond substantially to the explanation in respect of FIGS. 1 and 2.

FIG. 5 shows a fourth embodiment of an operating unit 1, wherein again the screen part 3 is arranged pivotable on the support 2 via a first hinge 13, and the operating part 4 is arranged on the screen part 3 via a second hinge 13.

The motion-coupling of the operating part 4 relative to the screen part 3 is implemented via the mechanism 7 in this embodiment.

In this embodiment, the mechanism 7 has a control disk 17 connected rigidly to the support 2.

The control rod 20, along with the control wheel 18 fastened to the control rod 20, is guided towards the control disk 17 by the spring 19. Thus, the control wheel 18 always rests against an outer contour of the control disk 17.

The control rod 20, and thus the control wheel 18, is guided on the screen part 3. Therefore, when the screen part 3 pivots it likewise performs this movement.

At the opposite end of the control rod 20 to the control wheel 18, the control rod 20 is connected to the operating part 4 via the link point 21.

When the operator 5 now pivots the screen part 3 (as indicated by the arrow marked in FIG. 5), as the screen part 3 is pivoted the control rod 20 is pivoted along with it, whereby the control wheel 18 is moved on the fixed control disk 17 and thus the control rod 20 is displaced relative to the screen part 3.

As a result of this displacement of the control rod 20, the link point 21 is displaced, whereby the operating part 4 is pivoted relative to the screen part 3.

Consequently, a motion-coupling between screen part 3 and operating part 4 is effected via the geometric configuration of the outer contour of the control disk 17 of this embodiment of FIG. 5.

The molding machine represented by way of example in FIG. 6 is an injection-molding machine 15 and has an injection unit 23 and a clamping unit 22, which are arranged together on a machine frame 24. Alternatively, the machine frame 24 could also be formed in several parts.

The clamping unit 22 has a stationary platen 25 and a movable platen 26 displaceable relative thereto.

Alternatively, embodiment variants with an end plate are also possible. Such clamping units are also called three-plate clamping units.

The movable platen 26 can be moved relative to the machine frame 24 via a clamping drive not represented here.

Mold halves of a molding tool 27 can be clamped or mounted on the fixed platen 25 and the movable platen 26 (represented by dashed lines).

The fixed platen 25 and the movable platen 26 can be mounted and guided relative to each other using crosspieces 28.

The molding tool 27 represented closed in FIG. 6 has at least one cavity. An injection channel, via which a plasticized material of the plasticizing unit 29 can be supplied, leads to the cavity.

The injection-molding machine 15 shown in FIG. 6 has an injection unit 23, wherein the injection unit 23 shown in this embodiment has an injection screw which is also used for plasticizing a material to be plasticized.

The injection screw is mounted axially displaceable along a longitudinal axis in the injection cylinder 30.

These movements are driven via a schematically represented drive device 31.

This drive device 31 preferably comprises a hydraulic rotary drive for the rotational movement and a linear hydraulic drive for the axial injection movement.

The plasticizing unit 29 (and thus the injection unit 23) is in signaling connection with the central control or regulating device 32.

Control commands are output to the plasticizing unit 29, the injection unit 23 or to the clamping unit 22, for example, by the central control or regulating device 32.

The central control or regulating device 32 can be connected to an operating unit 1 via a signal-conducting connection or be an integral component part of such an operating unit 1.

The operating unit 1 can be in signal connection with the central control or regulating device 32 of the injection-molding machine 15 and/or be formed as an integral component part of the central control or regulating device 32.

According to an embodiment of the present invention, the operating unit 1 has a screen part 3 and an operating part 4.

LIST OF REFERENCE NUMBERS

1 operating unit
2 support
3 screen part
4 operating part
5 operator
6 operating element
7 mechanism
8 first drive unit
9 second drive unit
10 first sensor
11 second sensor
12 control or regulating unit
13 hinge
14 bearing element
15 injection-molding machine
16 field of view
17 control disk
18 control wheel
19 spring
20 control rod
21 link point
22 clamping unit
23 injection unit
24 machine frame
25 fixed platen
26 movable platen
27 molding tool
28 crosspiece
29 plasticizing unit
30 injection cylinder
31 drive device
32 control or regulating device

The invention claimed is:

1. An operating unit for a molding machine comprising:
a support;
a screen part mounted pivotable on the support; and
an operating part mounted pivotable on at least one of the screen part and the support, wherein the screen part and the operating part are configured to be pivotable relative to each other and fixed in any one of a plurality of different use positions for an operator, and
wherein the operating part is motion-coupled to at least one of the screen part and the support by at least one of a mechanism and a drive unit such that a first relative angle between the support and the screen part determines a second relative angle between the screen part and the operating part
wherein the support:
is mounted rigid on the molding machine; or
is connected to the molding machine via a bearing element configured to allow a movement of the support relative to the molding machine.

2. The operating unit according to claim 1, wherein the support, the screen part, and the operating part have at least one of the following configurations:
the screen part is mounted pivotable relative to the support; and
the operating part is mounted pivotable relative to at least one of the screen part and the support about a horizontal axis.

3. The operating unit according to claim 1, wherein the second relative angle is inversely proportional to the first relative angle as a result of the motion-coupling.

4. The operating unit according to claim 1, wherein the first relative angle $\alpha$ and the second relative angle $\beta$ have the following relationship to each other:

$$\alpha + \beta + \gamma = \frac{\pi}{2}$$

wherein the variable y represents a constant or a function $f(\alpha), f(x)$.

5. The operating unit according to claim 1, wherein the screen part is mechanically coupled to the operating part via a compulsory guide to have at least one of the following configurations:
when the screen part is pivoted, the operating part is pivoted along with the screen part, and
when the operating part is pivoted, the screen part is pivoted along with the operating part.

6. The operating unit according to claim 1, further comprising at least one of:
a first drive unit connected to the operating part, and
a second drive unit connected to the screen part.

7. The operating unit according to claim 1, further comprising at least one of:
a first sensor connected to the operating part, and
a second sensor connected to the screen part.

8. The operating unit according to claim 6, further comprising a controller connected in a signal-conducting manner to have at least one of the following configurations:
connected to at least one of a first sensor connected to the operating part and a second sensor connected to the screen part; and
connected to at least one of the first drive unit and the second drive unit.

9. The operating unit according to claim 8, wherein the controller is configured:
to detect a pivoting of the operating part or the screen part by the corresponding first sensor or the second sensor; and to pivot the screen part or the operating part by the first drive unit or the second drive unit.

10. The operating unit according to claim 8, wherein the controller is configured:

to detect a pivoting of the operating part or the screen part by the corresponding first sensor or the second sensor; and to actuate at least one of the first drive unit and the second drive unit to support the detected pivoting.

11. The operating unit according to claim 1, further comprising a hinge tiltably connecting the screen part or the operating part to at least one of the support, the operating part, and the screen part.

12. The operating unit according to claim 1, wherein the operating part has a receiving device, and a mobile element of the operating part is removable from the receiving device.

13. The operating unit according to claim 1, further comprising at least one of the following:

a damper configured to damp a pivoting of the operating part or the screen part; and an arresting device configured to arrest the operating part or the screen part in at least one position relative to the support.

14. The operating unit according to claim 1, wherein the screen part is a flat screen.

15. The operating unit according to claim 1, wherein the operating part has at least one of the following configurations:

includes a mechanically actuatable operating element, and includes a flat screen.

16. The operating unit according to claim 1, wherein at least one of the operating part and the screen part is freely pivotable in a first angle range relative to the support, and the operating part is motion-coupled to the screen part in a second angle range.

17. An injection-molding machine comprising:

an operating unit including:

a support;

a screen part mounted pivotable on the support; and an operating part mounted pivotable on at least one of the screen part and the support, wherein the screen part and the operating part are configured to be pivotable relative to each other and fixed in any one of a plurality of different use positions for an operator, and wherein the operating part is motion-coupled to at least one of the screen part and the support by at least one of a mechanism and a drive unit such that a first relative angle between the support and the screen part determines a second relative angle between the screen part and the operating part.

18. The operating unit according to claim 14, wherein at least part of the flat screen is a touch pad.

19. The operating unit according to claim 15, wherein the operating part includes the flat screen, at least part of the flat screen being a touch pad.

* * * * *